US008026611B2

(12) United States Patent
Mohammed et al.

(10) Patent No.: US 8,026,611 B2
(45) Date of Patent: Sep. 27, 2011

(54) STACKED MICROELECTRONIC PACKAGES HAVING AT LEAST TWO STACKED MICROELECTRONIC ELEMENTS ADJACENT ONE ANOTHER

(75) Inventors: Ilyas Mohammed, Santa Clara, CA (US); Belgacem Haba, Saratoga, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 11/291,398

(22) Filed: Dec. 1, 2005

(65) Prior Publication Data

US 2007/0126102 A1   Jun. 7, 2007

(51) Int. Cl.
*H01L 23/48* (2006.01)

(52) U.S. Cl. ............... 257/776; 257/784; 257/E23.024; 257/E23.143; 257/E23.169

(58) Field of Classification Search .......... 257/686, 257/723, 730, 777, 698, 776, 784, E23.01, 257/E23.024, E23.143, E23.169, E23.17, 257/E23.175; 361/735, 790
See application file for complete search history.

(56) References Cited

U.S. PATENT DOCUMENTS

| 5,325,268 | A | | 6/1994 | Nachnani et al. |
| 5,325,628 | A | | 7/1994 | Yingling |
| 5,468,994 | A | | 11/1995 | Pendse |
| 5,841,191 | A | * | 11/1998 | Chia et al. ............. 257/691 |
| 6,020,629 | A | * | 2/2000 | Farnworth et al. ........ 257/686 |
| 6,215,193 | B1 | * | 4/2001 | Tao et al. ............... 257/777 |
| 6,252,305 | B1 | * | 6/2001 | Lin et al. .............. 257/777 |
| 6,388,333 | B1 | | 5/2002 | Taniguchi et al. |
| 6,404,648 | B1 | * | 6/2002 | Slupe et al. ............. 361/760 |
| 6,710,455 | B2 | * | 3/2004 | Goller et al. ............ 257/777 |
| 2002/0043709 | A1 | | 4/2002 | Yeh et al. |
| 2002/0074630 | A1 | | 6/2002 | Ando et al. |
| 2002/0171136 | A1 | | 11/2002 | Hiraoka et al. |
| 2003/0025199 | A1 | | 2/2003 | Wu et al. |
| 2003/0183917 | A1 | * | 10/2003 | Tsai et al. ............. 257/686 |
| 2004/0046239 | A1 | | 3/2004 | Sweterlitsch |
| 2004/0061146 | A1 | | 4/2004 | Tsai et al. |
| 2005/0087855 | A1 | | 4/2005 | Khandros et al. |
| 2005/0205979 | A1 | | 9/2005 | Shin et al. |
| 2005/0253229 | A1 | | 11/2005 | Fukui et al. |

FOREIGN PATENT DOCUMENTS

DE    10227305    9/2003
WO    WO-96/20550  7/1996

OTHER PUBLICATIONS

Office Action from corresponding Chinese Application 200680045248, dated Jul. 10, 2009.

* cited by examiner

*Primary Examiner* — Wael M Fahmy
*Assistant Examiner* — Sarah K Salerno
(74) *Attorney, Agent, or Firm* — Lerner, David, Littenberg, Krumholz & Mentlik, LLP

(57) ABSTRACT

A microelectronic assembly including a first and second microelectronic elements. Each of the microelectronic elements have oppositely-facing first and second surfaces and edges bounding the surfaces. The first microelectronic element is disposed on the second microelectronic element with the second surface of the first microelectronic element facing toward the first surface of the second microelectronic element. The first microelectronic element preferably extends beyond at least one edge of the second microelectronic element and the second microelectronic element preferably extends beyond at least one edge of the first microelectronic element.

9 Claims, 9 Drawing Sheets

STACKED MICROELECTRONIC PACKAGES HAVING AT LEAST TWO STACKED MICROELECTRONIC ELEMENTS ADJACENT ONE ANOTHER

BACKGROUND OF THE INVENTION

The present invention relates to microelectronic packages and more particularly to microelectronic packages such as semiconductor chip packages in which a plurality of semiconductor elements are stacked one on top of the other.

Semiconductor chips are commonly provided as individual, prepackaged units. In some unit designs, the semiconductor chip is mounted to a substrate or chip carrier, which is in turn mounted on a circuit panel, such as a printed circuit board. The circuit board usually has electrical conductors, normally referred to as traces extending in a horizontal direction parallel to the surface of the circuit board and terminals or other electrical conductive elements connected to the traces. The packaged chips are mounted so that the terminals disposed on each unit are electrically connected to contact pads or terminals of the circuit board. In this conventional arrangement, the theoretical minimum area of the circuit board must be at least equal to the aggregate areas of all the terminal-bearing surfaces of the individual prepackaged units. However, in practice, the circuit board must be somewhat larger than this. Thus, space issues often arise. Additionally, traces in these configurations must have significant length and impedance, so that appreciable time is required for propagation of signals along the traces and the speed of operation of the circuit is limited.

To alleviate these drawbacks, the "stacking" of units above one another in a common package is often employed. Essentially, in this type of design, the package itself has vertically extending conductors that are connected to the terminals of the circuit board. In turn, the individual chips within the package are connected to these vertically extending conductors. Because the thickness of a chip is substantially smaller than its horizontal dimensions, the internal conductors can be shorter than the traces on a circuit board that would be required to connect the same number of chips in a conventional arrangement. Examples of such stacked package designs are taught in U.S. Pat. Nos. 5,861,666; 5,198,888; 4,956,694; 6,072,233; and 6,268,649; and U.S. Patent Publication No. 2003/010711801, disclosures of which are hereby incorporated by reference herein. Oftentimes, the vertically extending conductors are in the form of solid balls or the like, which connect the prepackaged units to each other and to the circuit board.

Despite the considerable efforts in the art towards development of stacked packages, still further improvements would be desirable.

SUMMARY OF THE INVENTION

The present invention is directed to a microelectronic assembly having a first and second microelectronic elements. Each of the microelectronic elements have an oppositely-facing first and second surface and edges bounding the surfaces. The first microelectronic element may be superimposed on the second microelectronic element with the second surface of the first microelectronic element facing toward the first surface of the second microelectronic element. The first microelectronic element may extend beyond at least one edge of the second microelectronic element and the second microelectronic element may extend beyond at least one edge of the first microelectronic element.

The first and second microelectronic elements may each have a length and a width with the lengths being greater than the widths. The first microelectronic element may be superimposed on the second microelectronic element such that the length of the first microelectronic element is transverse to the length of the second microelectronic element. The two microelectronic elements may also be arranged along a third axis. The third axis is perpendicular to the first two axes. At least one edge of the first microelectronic element and at least one edge of the second microelectronic element may be parallel to one another in a direction of the third axis.

The microelectronic package may also include a substrate having a first surface and an oppositely-facing second surface. The substrate may be positioned between the first microelectronic element and the second microelectronic element such that the first surface of the substrate faces the second surface of the first microelectronic element and the second surface of the substrate faces the first surface of the second microelectronic element. The substrate may include bonding contacts and terminals wherein at least some of the bonding contacts and terminals are exposed at a surface of the substrate. The first and second microelectronic elements may also have contacts disposed at a respective surface. And at least some of these contacts may be electrically connected to at least some of the bonding contacts of the substrate.

The substrate may include at least one edge wherein at least some of the wire leads extend from at least one of the contacts across the edge to at least some of the bonding contacts. At least some of the traces may extend adjacent the edge of the substrate such that at least some of the traces are disposed between at least some of the bonding contacts and the edge.

DETAILED DESCRIPTION

Figure 1:
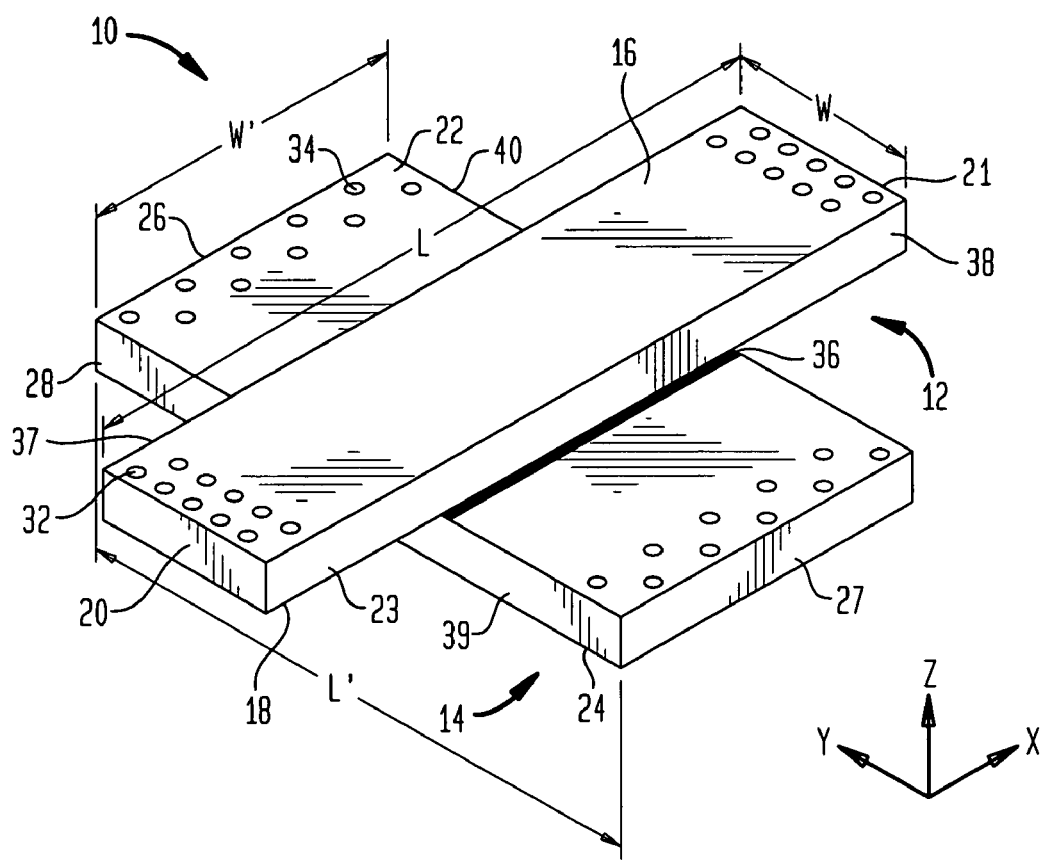
FIG. 1 is a perspective view of an assembly according to one embodiment of the present invention.

A microelectronic assembly 10 according to one embodiment of the present invention includes a first microelectronic element 12 and a second microelectronic element 14, as shown in FIG. 1. The first microelectronic element 12 and the second microelectronic element 14 may be semiconductor chips, interposers, circuit panels, modules, integrated passives on chip (IPOCs) or various other passive and active elements.

The first microelectronic element 12 includes a first surface 16, an oppositely-facing second surface 18 and edges 20, 21 adjacent the first surface 16 and the second surface 18. The edges 20, 21 are part of a perimeter 23 that extends around the first microelectronic element 12. The second microelectronic element 14 includes a first surface 22, an oppositely-facing second surface 24 and edges 26, 27 adjacent the first surface and the second surface. The edges 26, 27 are part of a perimeter 28 that extends around the second microelectronic element 14.

The first microelectronic element 12 overlies the second microelectronic element 14, such that the second surface 18 of the first microelectronic element 12 faces the first surface 22 of the second microelectronic element 14.

As shown in FIG. 1, edges 20 and 21 of the first microelectronic element 12 extend outwardly past the perimeter 28 of the second microelectronic element 12, and edges 26 and 27 of the second microelectronic element 14 extend outwardly past the perimeter 23 of the first microelectronic element 12.

The first microelectronic element 12 has a length L and a width W and the second microelectronic element 14 has a length L' and a width W'. The lengths L and L' have a dimension that is greater than the dimension of widths W and W', although this is not required. Also, as shown in FIG. 1, the length L of the first microelectronic element 12 is transverse to the length L' of the second microelectronic element 14 and more preferably the two lengths L and L' are orthogonal to one another. For ease of illustration, FIG. 1 is arranged along a coordinate system with length L' aligned in a direction along a Y-axis and length L aligned in a direction along an X-axis, perpendicular to the Y-axis. The two microelectronic elements 12, 14 are stacked onto one another in a direction along a Z-axis. The coordinate system described herein is only used for ease of illustration and does not refer to any gravitational positioning. Descriptive words such as "top" "bottom" "upper" and "lower" are similarly only used for illustration purposes only.

FIG. 1 also illustrates examples of some of the various features that may be included within the microelectronic assembly 10. First microelectronic element 12 may include a plurality of contacts 32 exposed at its first surface 16. The contacts 32 may project above the first surface 16, be recessed within the first surface or be planar with the surface of the first microelectronic element 12. Second microelectronic element 14 also includes a plurality of contacts 34 exposed at the first surface 22 of the second microelectronic element 14. Similar to the contacts 32 of the first microelectronic element 12, the contacts 34 of the second microelectronic element 14 enable an electrical connection between the second microelectronic element 14 and another microelectronic element.

Also, as shown in FIG. 1, the first microelectronic element 12 may be connected to the second microelectronic element 14 by an encapsulant material or underfill 36. The encapsulant material 36 may include an epoxy, silicone or other adhesive material. The underfill 36 may also be a thermally-conductive material that permits heat to dissipate from the microelectronic elements 12, 14. Although not shown in the figures, the first microelectronic element 12 may be connected or attached to the second microelectronic element 14 by any method known to those in the art including but not limited to features that enable the elements to be snap fitted to one another or even formed integrally together. The microelectronic elements 12, 14 may also be temporarily affixed to one another by various vices, molds and the like, while various features described herein are added to the assembly. After the features have been added, the vices may be removed and an encapsulant material applied to the assembly to thereby provide stability and structure to the microelectronic assembly 10.

The first microelectronic element 12 may also include edges 20 and 21, as well as edges 37 and 38. And the second microelectronic element 14 may also include edges 26 and 27, as well as edges 39 and 40. In the embodiment shown in FIG. 1, edge 20 of the first microelectronic element is parallel to edge 39 of the second microelectronic element 14 in the X-direction. And edge 21 is also parallel to edge 39 of the second microelectronic element 14. Further, either one or both of the edges 37 and 38 of the first microelectronic element 12 may be parallel to edges 26 and 27 of the second microelectronic element 14 in the Y-direction.

Figure 2:
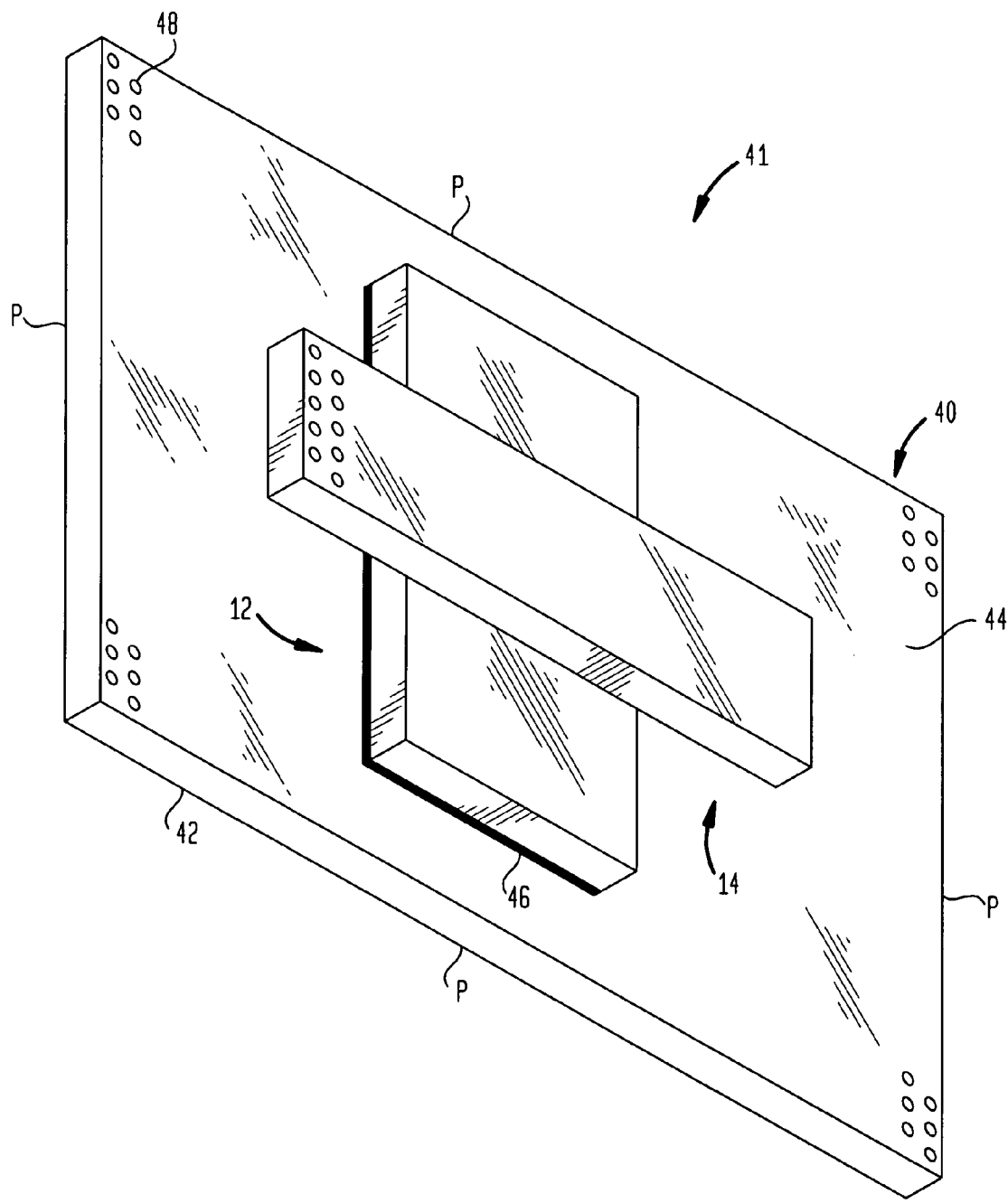
FIG. 2 is a perspective view of a package according to one embodiment of the present invention.

The microelectronic element assembly 10 may include a substrate 40 having a top surface 42 and an oppositely-facing bottom surface 44, as shown in FIG. 2. The substrate may include a layer of polyimide or other dielectric material. The substrate may also be formed by any known composition known by those in the art. A solder mask layer (not shown) may be disposed on the single metal layer.

A package 41, according to an embodiment of the present invention, may include the assembly of FIG. 1 connected with the substrate 40, as shown in FIG. 2. Substrate 40 is positioned overlying the first microelectronic element 12 such that the bottom surface 44 of the substrate faces the first surface 16 of the first microelectronic element 12. An adhesive material 46 or underfill may be used to connect the first microelectronic element 12 to the bottom surface 44 of the substrate 40. The encapsulant material may be replaced by an adhesive or thermal-conductive layer or an element that performs both functions.

Figure 4:
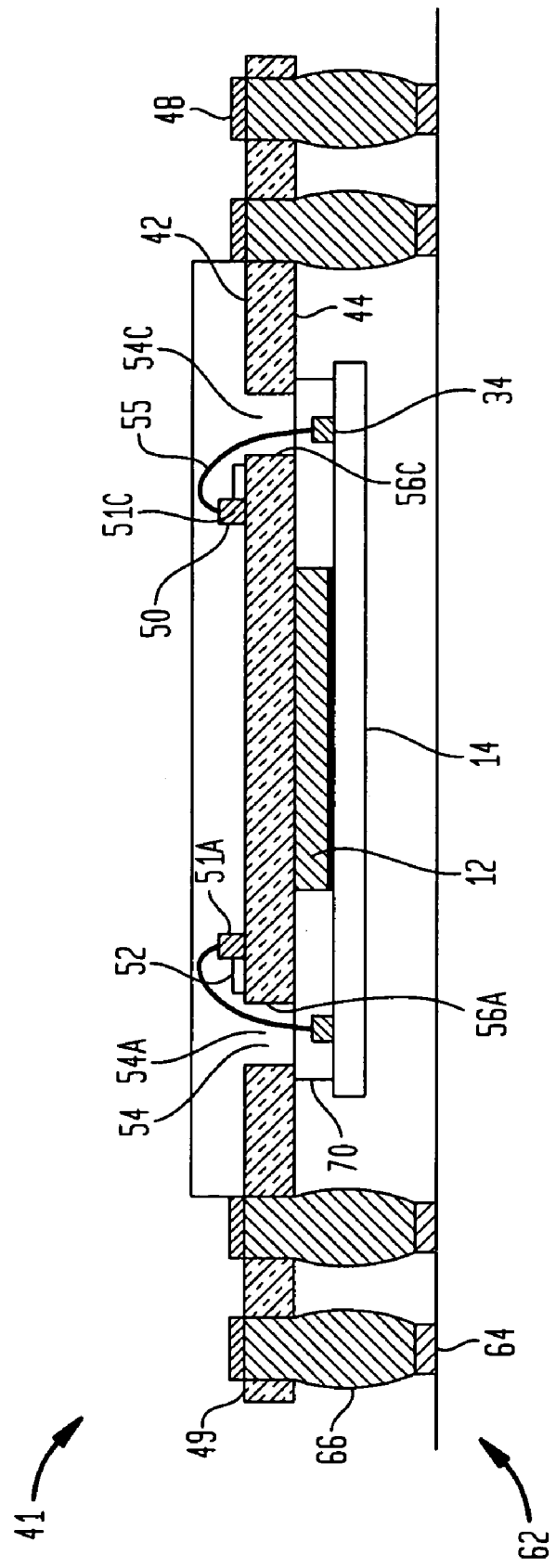
FIG. 4 is a cross-sectional view of the embodiment of FIG. 2 attached to a circuit panel.

Substrate 40 includes a plurality of terminals 48 exposed at the top surface 42 and exposed at the bottom surface 44 of the substrate through hole 49, best shown in FIG. 4. Although not required, the terminals 48 may be positioned along a perimeter P of the substrate and more preferably the terminals are positioned at the corners of the substrate.

Figure 3:
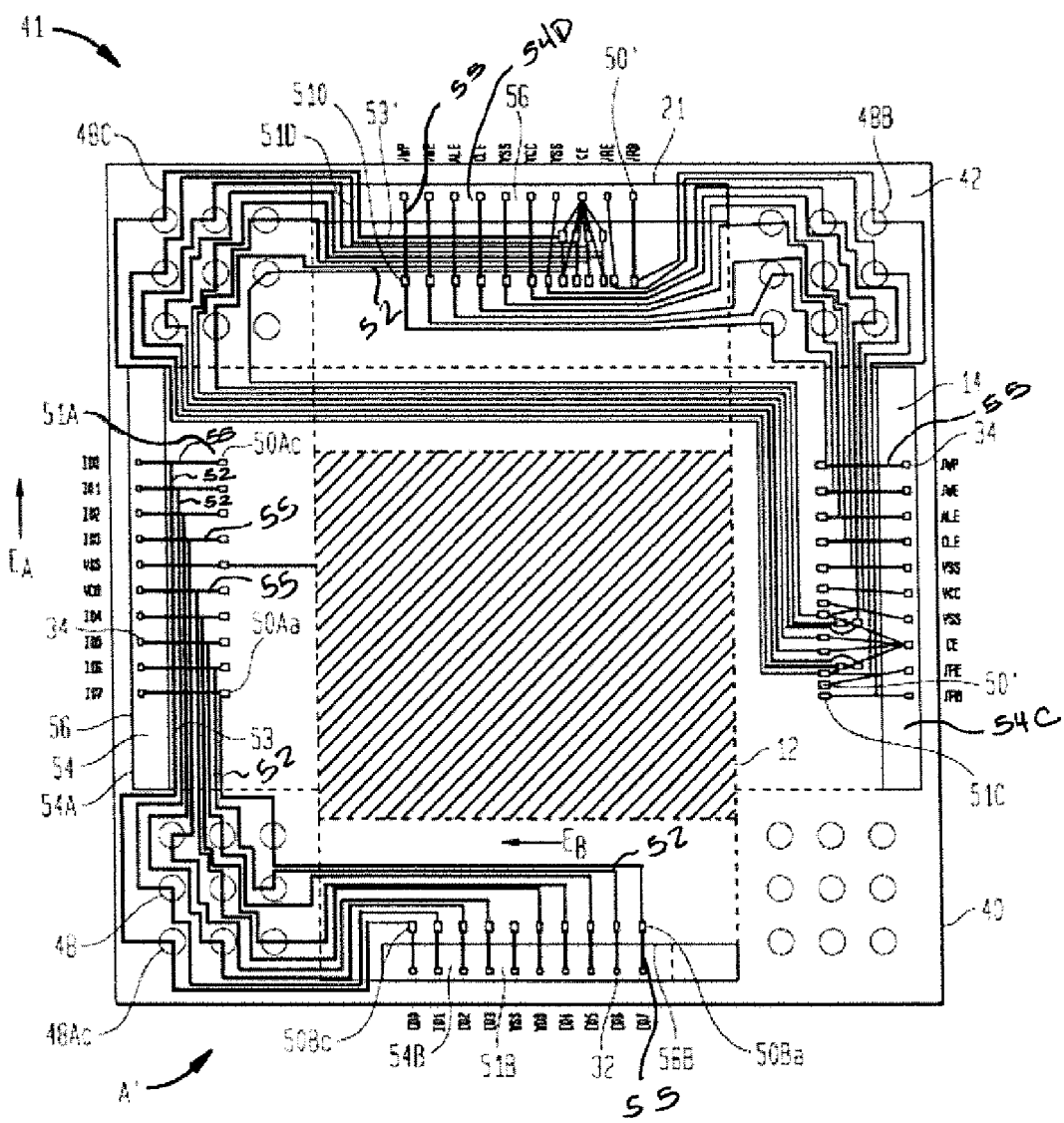
FIG. 3 is a top schematic view of the embodiment of FIG. 2.

As shown in FIG. 3, the substrate 40 may include bonding contacts 50 exposed at the top surface 42 of the substrate. At least some of the bonding contacts 50 are electrically connected to at least some of the terminals 48 by traces 52 disposed on or within the substrate 40. The electrical interconnecting elements such as terminals 48, bonding contacts 50, and traces 52 of the substrate 40 may be formed in two or more layers. In the embodiment of FIGS. 2 and 3, the interconnecting elements are formed using a single layer of metal.

Substrate 40 also includes a plurality of apertures 54 extending from the top surface 42 to the bottom surface 44. In one preferred embodiment of the present invention, the apertures 54 are aligned with the contacts 32 and 34 of the first microelectronic element and second microelectronic element, respectively. Therefore, the apertures overlie and allow access to the respective microelectronic elements. Each of the apertures 54 is partially defined by an edge 56.

In order to electrically interconnect the microelectronic elements 12 and 14 to the substrate 40, an electrical interconnection element may be included in the microelectronic assembly 41 between contacts 32, 34 and bonding contacts 50. The interconnection element may be in the form of wire leads 55 extending from contacts 32, 34, through apertures 54, across edges 56 to bonding contacts 50. The wire leads 55 connect the contacts 32, 34 of the first microelectronic element 12 and the second microelectronic element 14 to the bonding contacts 50 of the substrate 40.

The bonding contacts 50 are connected to terminals of the substrate by traces 52. The traces 52 include various sections, angles and turns as well as runs 53 extending in an edgewise direction denoted by the arrow E parallel to an edge 56 of the substrate bounding a slot.

At least some of the bonding contacts 50 are disposed in rows 51 near apertures 54. Each row of bonding contacts extends in an edgewise direction, parallel to the adjacent edge 56 of the slot. For example, a row 51A of bonding contacts adjacent to slot 54A extends in the edgewise direction E adjacent the edge 56 of apertures 54A, whereas the bonding contacts in row 51B extend in an edgewise direction parallel to the edge 56 of slot 54B.

The bonding contacts of row 51A are connected in an arrangement referred to herein as a "trace-proximate" arrangement, with at least some of the runs 53 of traces 52 connected to the bonding contacts 50 extending between the bonding contacts and the edge 56 of the adjacent apertures 54A. The bonding contacts of row 51A are connected to a group of terminals 48A close to one end of the aperture. The bonding contact 50Aa closest to this group of terminals is connected to the run 53Aa furthest from the edge 56, which in turn is connected to terminal 48Aa. The bonding contact 50Ac furthest from this group of terminals is connected to the run 53Ac closest to edge 56, which in turn is connected to terminal 48Ac. In the same manner, the other bonding contacts are connected to trace runs, and hence to terminals in group 48A. The order of connection to the terminals corresponds to the order of contact position in edgewise direction $E_A$, i.e., the edgewise direction along edge 56A away from terminal group 48A.

The bonding contacts and traces of row 51B are connected in the reverse arrangement, referred to herein as a "trace-remote" arrangement. In the trace-remote arrangement, at least some of the runs 53 of traces 52 connected to the bonding contacts of the row lie between the runs connected to those contacts and the edge 56 of the adjacent aperture 54B. The bonding contacts of row 51B are also connected to the same group of terminals 48A. In row 51B, the bonding contact 50Ba furthest from the group of terminals 48A is connected to the run 53Ba furthest from edge 56B, which in turn is connected to terminal 48Aa. The bonding contact 50Bc closest to the group of terminals 48A is connected to the run 53Bc closest to edge 56B, which in turn is connected to terminal 48Ac. Here again, the other bonding contacts in row 51B are connected to trace runs, and hence to terminals in group 48A in order according to their contact position. The order of connection to the terminals corresponds to the order of contact position in edgewise direction $E_B$, i.e., the edgewise direction along edge 56B towards terminal group 48A.

This arrangement provides two rows of bonding terminals having identical order of connection to terminals, but running in two different edgewise directions, without crossovers, so that all of the traces can be formed in a single metal layer. The identically-connected rows of bonding terminals allow for common connections to be made to identical chips. For example, the contact labeled "IO7" on chip 12 is connected to bonding contact 50Ba and hence to terminal 48a, whereas the identical contact 34, labeled IO7 on chip 14 is connected to bonding contact 50Aa and hence to the same terminal 48a.

Most of the bonding contacts in row 51C are connected in a trace-proximate arrangement to terminal group 48B, whereas most of the bonding contacts in row 51D are connected in a trace-remote arrangement to the same terminal group 48B. Here again, the use of trace-remote and trace-proximate arrangements allows for the order of connections to the terminals of group 48B within row 51D to be identical to the order of connections to the same terminals within row 51C, without crossovers. Sets of chip-enable bonding contacts 50' are interspersed in rows 51C and 51D. The chip-enable bonding contacts are connected by additional traces to terminals in group 48 C. Note that some of these additional traces have runs 53' extending between bonding contacts of row 51D and the adjacent edge of aperture 54D.

Wire leads 55 formed by a wire-bonding process connect the bonding contacts to the contacts 32 and 34 of the chips. The wire bonds associated with each row of bonding contacts extend across the adjacent edge 56, and extend through the adjacent aperture 54 to one of the chips. For example, as shown in FIGS. 3 and 4, the wire bonds associated with the bonding contacts of rows 51A and 510 extend through slots 54A and 54C. Some of the wire bonds extend across the runs 53 of some of the traces. For example, the wire bonds 55 associated with bonding contacts of rows 51A and 51C, having a trace-proximate arrangement, extend across associated runs. As best seen in FIG. 4, the wire bonds loop up and over the traces. Similarly, the wire bonds associated with some of the contacts in row 51D (FIG. 3) cross over the run 53' associated with the chip enable contacts. The wire bonds provide crossovers at essentially zero cost; as the wire bonds must be provided in any event to make the connections between the contacts on the chips and the bonding contacts. Little or no additional cost is involved in forming the wire bond 55 with a slight upward rise to allow the wire bond to cross over the traces 52. Typically, one wire bond 55 is connected to each chip contact 32, 34. FIG. 3 depicts the chip enable contacts (labeled "CE") as connected to all of the chip-enable bonding contacts 50'; in practice, each chip enable contact is connected to only one chip-enable bonding contact, and hence connected to only one terminal in group 48C. Different chips are connected to different terminals in group 48C.

As shown in FIG. 4, the microelectronic assembly 41 may include an encapsulant material 60 adhered to the top surface 42 of the substrate 40. The encapsulant material 60 protects and maintains the integrity of the wire leads 55 interconnecting the bonding contacts 50 to the contacts 32, 34 of the microelectronic elements 12, 14. Also, as shown in FIG. 4, the terminals 48 enable the microelectronic assembly 41 to be electrically connected to a microelectronic element such as circuit panel 62. The circuit panel 62 includes terminals 64 exposed at a surface of the circuit panel. An electrical interconnection, such as a mass of solder 66 may be used to electrically connect terminals 48 of the substrate 42 to terminals 64 of the circuit panel 62.

Due to the relative thinness of the microelectronic assembly 41, the electrical interconnections between the package and the circuit panel 62 may be made without interfering with the positioning of the first microelectronic element 12 and second microelectronic element 14. An additional encapsulant 70 may be disposed about the first microelectronic element 12 and second microelectronic element 14 to not only connect the microelectronic elements to the substrate 40 but also to maintain the integrity of the wire leads 55 extending through the apertures 54 of the substrate.

Figure 5:
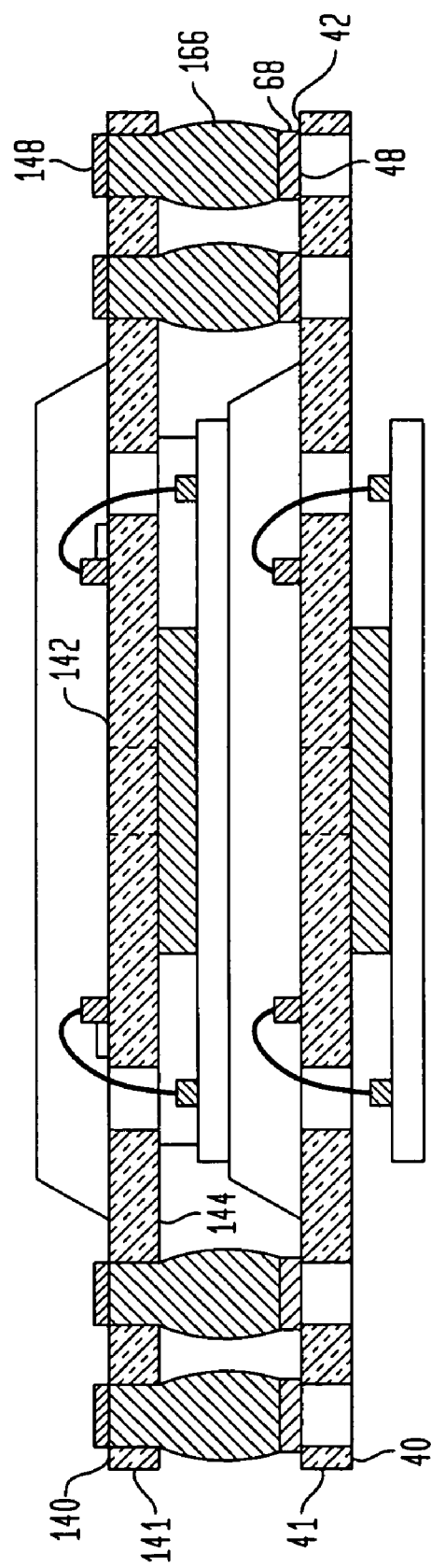
FIG. 5 is a cross-sectional view of a stacked package according to one embodiment of the present invention.

As shown in FIG. 5, the microelectronic assembly 41 may be positioned with a second microelectronic assembly 141 overlying the assembly. The second microelectronic assembly 141 may be substantially similar to the first microelectronic assembly 41 with similar features and elements. The second microelectronic assembly 141 preferably has terminals 148 exposed at a top surface 142 and exposed at a bottom surface 144 of a substrate 140. The terminals 148 may be electrically connected to the terminals 48 of the first microelectronic assembly 41 by, for example, masses of solder 166. Although only two semiconductor packages are shown stacked on top of one another, the present invention contemplates any number of packages being stacked on top of each other. In a further variant, terminals 48, 148 may not be exposed at respective top surfaces 42, 142 if not required. An encapsulant may be adhered to the top surface 142 of the substrate 140 to protect and maintain the integrity of the wire leads 155.

Figure 6:
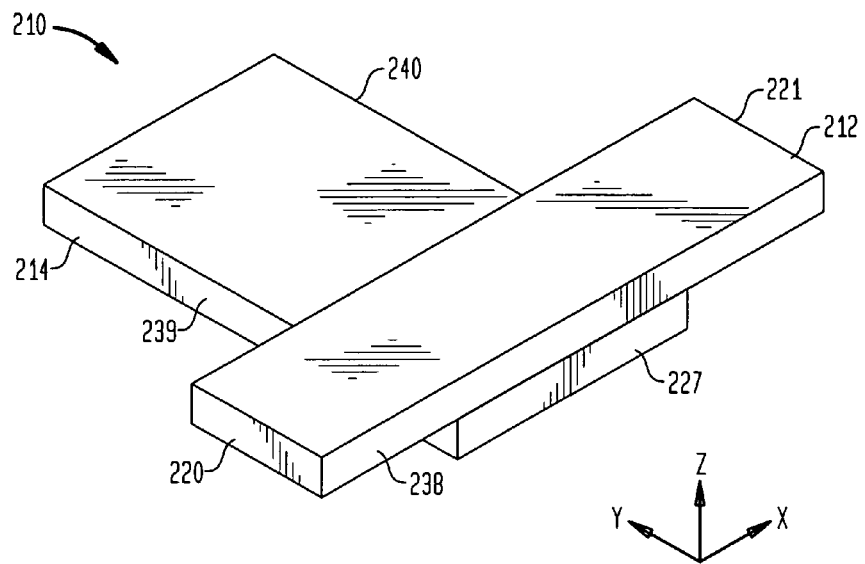
FIG. 6 is a perspective view of an assembly according to an additional embodiment of the present invention.

As shown in FIG. 6, a first microelectronic element 212 may overlie a second microelectronic element 214 with an edge 238 of the first microelectronic element 212 parallel with an edge 227 of the second microelectronic element 214 in the X-direction. Edges 220, 221 of the first microelectronic element 212 may extend outwardly past edges 239 and 240 of the second microelectronic element 214, respectively. Although both edges 220 and 221 are shown extending outwardly past the respective edges of the second microelectronic element, this is not required and only one edge of the microelectronic element may extend outwardly past an edge of the second microelectronic element. The microelectronic package 210 shown in FIG. 6, may include various features and elements included in previous embodiments discussed herein. For instance, a substrate similar to substrate 40 may be included with the microelectronic package 210 to create an assembly.

The present invention has been illustrated in the figures with microelectronic elements having a rectangular shape. In alternate embodiments, the microelectronic elements may have any shape, including but not limited to, square, triangular, oval and circular.

Figure 7:
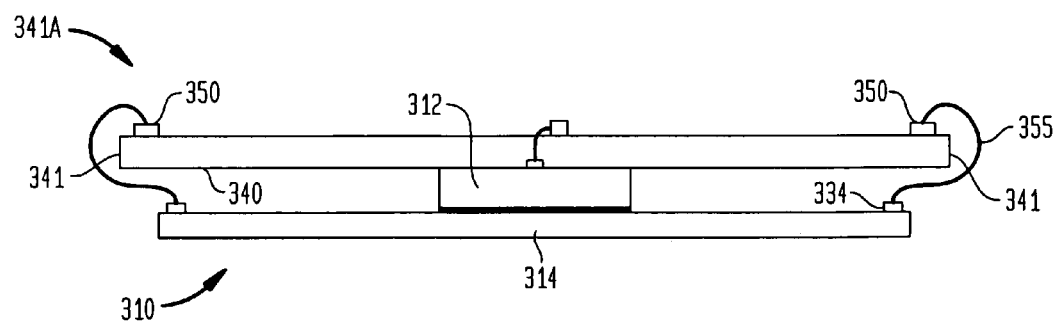
FIG. 7 is a cross-sectional view of a package according to an additional embodiment of the present invention.

In still yet another alternate embodiment as shown in FIG. 7, wire leads 355 may extend across edges 341 of substrate 340, to thereby electrically connect contacts 332, 334 exposed on the first microelectronic element 312 and second microelectronic element 314 to bonding contacts 350 exposed on substrate 340. An encapsulant material may be placed around the microelectronic semiconductor package 310 to maintain the rigidity and stability of the package.

Figure 8:
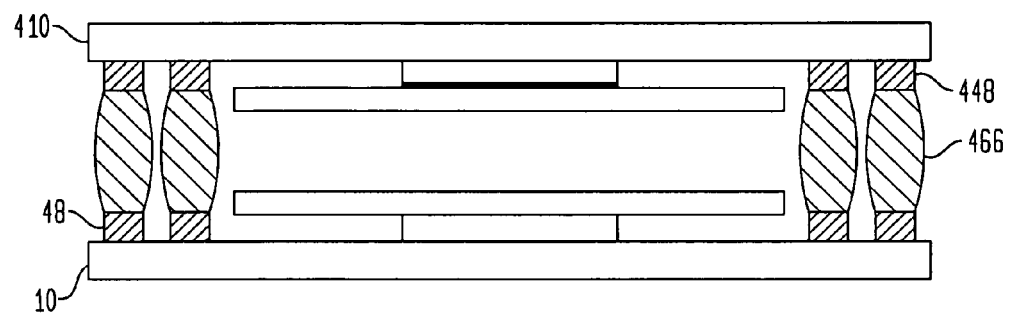
FIG. 8 is a cross-sectional view of an alternate embodiment of a stacked package according to the present invention.

As shown in FIG. 8, the microelectronic assembly 41 of FIG. 3 may be stacked in facing relationship to a second microelectronic assembly 441. The second microelectronic assembly 441 may include many of the same features and elements illustrated in reference to previous embodiments discussed herein. For ease of illustration, some of these features are not illustrated in the figure. With the two microelectronic assemblies facing one another, the terminals 48 of the first microelectronic assembly 41 and terminals 448 of the second microelectronic assembly 441 also face one another. An electrical connection 466 may be disposed between the terminals 48, 448 in order to connect them and create a stacked microelectronic package. Contact pads (not shown) may be positioned on substrate 40 in order to connect the package to a circuit panel, for example.

Figure 9:
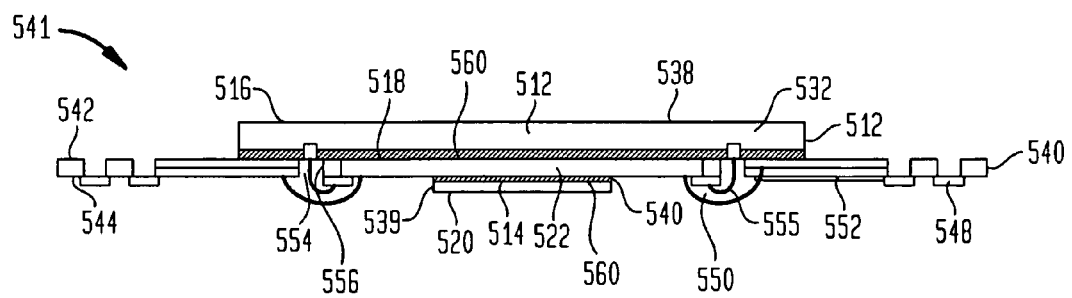
FIG. 9 is a cross-sectional view of a package according to an alternate embodiment of the present invention taken along a first axis.
Figure 10:
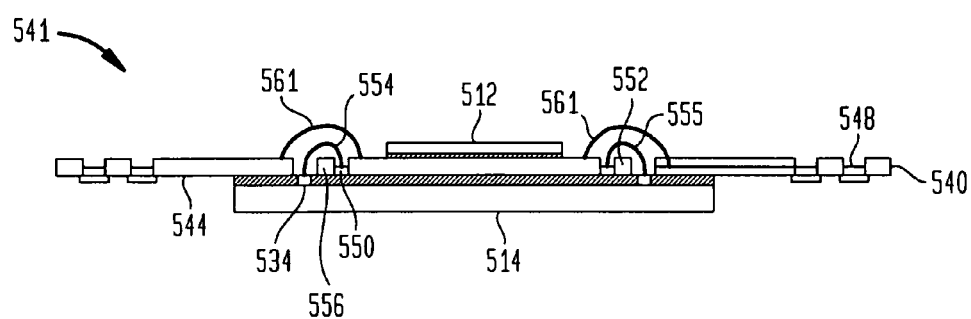
FIG. 10 is a cross-sectional view of the embodiment of FIG. 9 taken along a second axis perpendicular to the first axis.

In yet another alternate embodiment, microelectronic assembly 541 may include a first microelectronic element 512 and a second microelectronic element 514 as shown in FIGS. 9 and 10. The first microelectronic element 512 includes a first surface 516 and an oppositely-facing second surface 518. The second microelectronic element 514 also includes a first surface 520 and an oppositely-facing second surface 522. The microelectronic assembly 541 also includes substrate 540 having a first surface 542 and a second surface 544. The first microelectronic element 512 is positioned overlying the substrate 540 such that the second surface 518 of the first microelectronic element confronts the top surface 542 of the substrate 540. And, the second microelectronic element 514 is positioned underlying the substrate 540, such that the second surface 522 of the microelectronic element confronts the bottom surface 544 of the substrate.

The microelectronic elements 512, 514 may be attached to the substrate 540 by an underfill or encapsulant 560. The two microelectronic elements 512, 514 are arranged similar to previous embodiments discussed herein except that the substrate 540 is positioned between the elements. Thus, in a most preferred embodiment, at least one of the edges 520, 521 of the first microelectronic element 512 extends outwardly beyond one of the edges 539, 540 of the second microelectronic element 514. And, at least one of the edges 526, 527 of the second microelectronic element 514 extends outwardly past one of the edges 537, 538 of the second microelectronic element 514. Thus, in the most preferred embodiment, the two microelectronic elements are positioned in a criss-cross relationship with the substrate disposed therebetween.

The first microelectronic element 512 and the second microelectronic element 514 also preferably include contacts 532, 534 exposed at their respective second surfaces 518, 522. The contacts 532, 534 are preferably aligned with apertures 554 extending from the top surface 542 to the bottom surface 544 of the substrate 540. The substrate 540 further includes terminals 548 exposed at either, or both of the top surfaces 542 or the bottom surface 544 and bonding contacts 50 exposed at both the top and bottom surfaces. At least some of the bonding contacts 550 are electrically connected with at least some of the terminals 548 by traces 552 as shown in FIG. 10. For ease of illustration, only some of the traces connecting the bonding contacts 550 to the terminals 548 are illustrated. As shown in FIG. 10, the metal layer may be disposed at the bottom surface 544 of substrate 540 with bonding contacts 550 exposed at the top surface 542 and the bottom surface 544 of the substrate.

In a method of electrically connecting the microelectronic elements 512, 514 to the substrate 540, electrical interconnections, i.e., wire leads 555, are attached to the contacts 532, 534. The wire leads 555 extend from the contacts 532, 534 through the apertures 554 of the substrate until attaching to the bonding contacts 550.

Therefore, the wire leads 555 extend from microelectronic elements 512 or 514 from one surface of the substrate 540—the top surface 542 for the first microelectronic element, and the bottom surface 544 for the second microelectronic element 514—to the opposite surface of the substrate. For instance, some of the wire leads 555 attach to contacts 332 of the first microelectronic element 512 adjacent the top surface 542 and extend through an aperture 554 across edge 556 to the opposing bottom surface 544 of the substrate 540, specifically the bonding contacts 550 disposed on the bottom surface. And in contrast, wire leads 555 connected to the second microelectronic element extend from contacts 534 adjacent the bottom surface 544 of the substrate to the top surface 542. Specifically to the bonding contacts 550 exposed at the top surface 542 of the substrate. An encapsulant material 561 may be disposed over the wire leads 555 to protect them. Similar to embodiments discussed earlier, microelectronic assembly 541 may be stacked onto a similar assembly or various other assemblies to form a stacked package.

Figure 11:
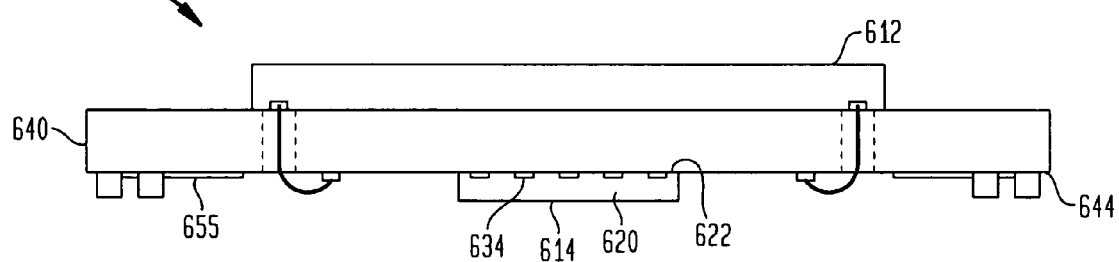
FIG. 11 is a cross-sectional view of a package according to an alternate embodiment of the present invention.

In an alternate embodiment as shown in FIG. 11, the microelectronic assembly 641 may include a substrate 640 and first microelectronic element 612 formed similarly to the first microelectronic element and substrate of FIGS. 9 and 10. But, the second microelectronic element 614 differs from the one illustrated in FIGS. 9 and 10 in that it is electrically interconnected to the substrate 640 at the bottom surface 644 of the substrate. The second microelectronic element 614 preferably may include contacts 634 exposed along a second surface 622 of the second microelectronic element. The contacts may be electrically connected to the substrate 540 by either a ball-grid array, stud bumps, wire leads or additional electrical connecting mechanisms. The substrate 640 includes bonding contacts 50 exposed at its second surface 644 that can be interconnected to the contacts 634 of the second microelectronic element.

Figure 12:
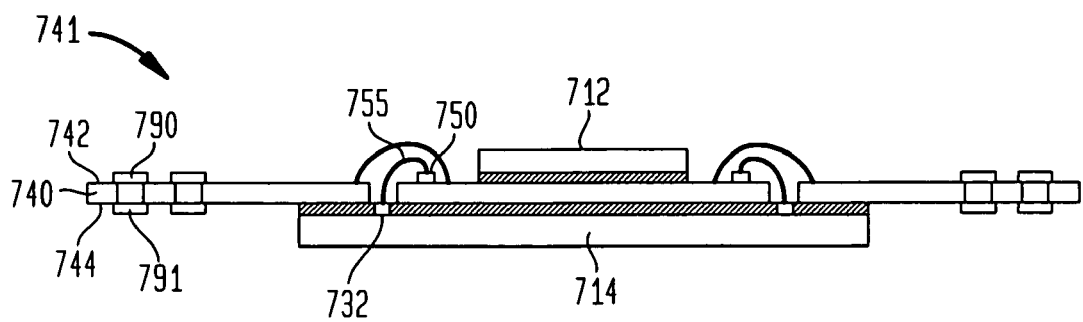
FIG. 12 is cross-sectional view of a package according to an additional embodiment of the present invention.

In yet another alternate embodiment as shown in FIG. 12, the microelectronic assembly 741 may be similarly constructed to the previous embodiments except that a substrate 740 includes a two metal layer construction wherein a first metal lay 790 is exposed at a top surface 742 of the substrate 740 and a second metal layer 791 is disposed at a bottom surface 744 of the substrate.

The microelectronic assembly 741, as with previous embodiments, includes a first microelectronic element 712 and a second microelectronic element 714. Each of the microelectronic elements may be attached to the substrate 740 in a method already discussed herein. One benefit of having a two metal layer is that bonding wires 755 connecting contacts 732 exposed at a first surface of a respective microelectronic element 712, 714, does not have to extend through the substrate 740 and then back around and through the substrate 740 once again in order to be bonded to the bonding contact 750 of the substrate 740.

Although not shown in the figures, the first metal layer 742 and the second metal layer 745 may each include a plurality of terminals, traces and bonding contacts as discussed with reference to previous embodiments herein.

Although various single metal layer embodiments and two metal layer embodiments have been discussed herein wherein the metal layers are exposed at a surface of a substrate, the present invention also contemplates a situation wherein either a single metal layer or a two metal layer are exposed within a substrate. The metal layer or layers may be exposed at one or both surfaces of the substrate depending on the specific requirements.

Figure 13:
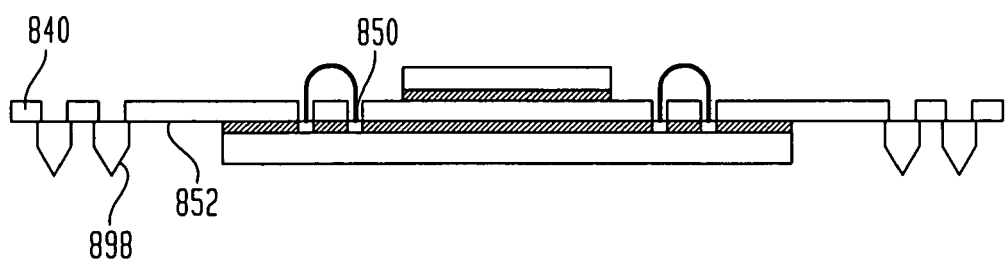
FIG. 13 is a cross-sectional view of a package according to an additional embodiment of the present invention.

In still another alternate embodiment of the present invention, a microelectronic assembly 841 may be constructed similar to any of the embodiments herein, but also include electrically-conductive posts or pillars 898 instead of or in combination with terminals. In one particular embodiment shown in FIG. 13, the pillars 898 extend downwardly from the substrate 840. The pillars 898 in combination with the traces 852 and bonding contacts 850 may be constructed as disclosed in commonly assigned U.S. patent application Ser. Nos. 10/985,119, 10/985,126 and 11/014,439, the disclosures of which are hereby incorporated herein by reference.

In yet in another alternate embodiment, not shown in the figures, the second microelectronic element 614 of FIG. 11 may have contacts disposed along the first surface 620 of the second microelectronic element. The contacts may be attached to bonding contacts exposed at the bottom surface 644 of the substrate 640 using wire leads. The substrate can optionally include additional trace layers. In addition, although the apertures 54 have been shown as elongated slots, they may have any configuration.

Although the present invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A microelectronic assembly comprising:
a substrate having a top surface, a bottom surface and a first edge extending between said top surface and said bottom surface, said substrate having a plurality of bonding contacts exposed at said top surface and a plurality of terminals, said substrate further having a plurality of traces connecting at least some of said bonding contacts to at least some of said plurality of terminals, at least some of said plurality of traces extending adjacent said first edge of the substrate so that said at least some of said plurality of traces are disposed between at least some of said bonding contacts and said first edge; and
a first microelectronic element underlying said substrate such that said bottom surface of said substrate faces toward said first microelectronic element, said first microelectronic element having contacts, at least some of said contacts being connected to at least some of said plurality of bonding contacts by wire leads, wherein at least some of said wire leads extend from at least some of said bonding contacts exposed at said top surface, over at least some of said plurality of traces and are not conductively connected with said at least some of said plurality of traces, and wherein said wire leads extend beyond said first edge to said contacts of said microelectronic element below said bottom surface of said substrate.

2. The microelectronic assembly according to claim 1, further comprising a second microelectronic element having a first surface and a second surface, wherein said first microelectronic element includes a first surface and a second surface, said second microelectronic element underlying said first microelectronic element such that said second surface of said first microelectronic element faces said first surface of said second microelectronic element.

3. The microelectronic assembly according to claim 2, wherein said second microelectronic element has contacts, at least some of said contacts of said second microelectronic element being connected to at least some of said plurality of bonding contacts of said substrate by wire leads.

4. The microelectronic assembly according to claim 3, wherein said substrate has a second edge and wherein at least some of said traces of said substrate are adjacent said second edge and between said second edge and at least some of said plurality of bonding contacts, wherein said wire leads connecting said contacts of said second microelectronic element extend from said contacts of said second microelectronic element across said second edge and over said traces adjacent said second edge to said plurality of bonding contacts.

5. The microelectronic assembly according to claim 4, wherein said substrate has a perimeter and said first edge and said second edge are disposed within said perimeter.

6. The microelectronic assembly according to claim 1, wherein a single contact of said contacts of said microelectronic element may be connected to more than one bonding contact of said substrate.

7. The microelectronic assembly according to claim 1, wherein at least some of said bonding contacts of said plurality of bonding contacts of said substrate are arranged in a first section and at least some of said terminals of said plurality of terminals of said substrate are arranged in a second section, wherein at least some of said traces connecting said bonding contacts of said first section to said terminals of said second section include runs, wherein at least some of said wire leads loop over some of said runs of said traces.

8. The microelectronic assembly according to claim 1, wherein some of said wire leads are conductively connected with at least other ones of said plurality of traces.

9. A microelectronic assembly comprising:

a substrate having a top surface, a bottom surface and a first edge extending between said top surface and said bottom surface, said substrate having a plurality of bonding contacts exposed at said top surface and a plurality of terminals, said substrate further having a plurality of traces connecting at least some of said bonding contacts to at least some of said plurality of terminals, at least some of said traces extending adjacent said first edge of the substrate so that at least some of said traces are disposed between at least some of said bonding contacts and said first edge;

and a first microelectronic element underlying said substrate such that said bottom surface of said substrate faces toward said first microelectronic element, said first microelectronic element having contacts, at least some of said contacts being connected to at least some of said plurality of bonding contacts by wire leads, wherein at least some of said wire leads extend from at least some of said bonding contacts exposed at said top surface over at least some of said plurality of traces to said contacts of the microelectronic element, wherein at least one of the wire leads extends from at least one of said bonding contacts over at least some of said plurality of traces and wherein at least one of said plurality of traces is not electrically connected with at least one of said bonding contacts.

* * * * *